United States Patent
Nakamura

(10) Patent No.: US 10,700,050 B2
(45) Date of Patent: Jun. 30, 2020

(54) METHOD OF MANUFACTURING POWER SEMICONDUCTOR MODULE INCLUDING A POWER SEMICONDUCTOR CHIP AND A CONTROL CHIP FORMED ACCORDING TO DIFFERENT PROCESS RULES, AND POWER SEMICONDUCTOR MODULE

(71) Applicant: Mitsubishi Electric Corporation, Tokyo (JP)

(72) Inventor: Hiroyuki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/057,860

(22) Filed: Aug. 8, 2018

(65) Prior Publication Data

US 2019/0123034 A1  Apr. 25, 2019

(30) Foreign Application Priority Data

Oct. 25, 2017  (JP) .................................. 2017-206085

(51) Int. Cl.
| | |
|---|---|
| *H01L 23/495* | (2006.01) |
| *H01L 25/18* | (2006.01) |
| *H01L 21/56* | (2006.01) |
| *H01L 23/31* | (2006.01) |
| *H01L 23/00* | (2006.01) |
| *H01L 25/00* | (2006.01) |

(52) U.S. Cl.
CPC ............ *H01L 25/18* (2013.01); *H01L 21/565* (2013.01); *H01L 23/3121* (2013.01); *H01L 23/49524* (2013.01); *H01L 23/49541* (2013.01); *H01L 23/49575* (2013.01); *H01L 24/48* (2013.01); *H01L 25/50* (2013.01); *H01L 23/3107* (2013.01); *H01L 2224/48091* (2013.01); *H01L 2224/48106* (2013.01); *H01L 2224/48137* (2013.01); *H01L 2224/48247* (2013.01); *H01L 2924/00014* (2013.01); *H01L 2924/13055* (2013.01); *H01L 2924/13091* (2013.01); *H01L 2924/181* (2013.01)

(58) Field of Classification Search
None
See application file for complete search history.

(56) References Cited

U.S. PATENT DOCUMENTS

| | | | |
|---|---|---|---|
| 6,642,599 B1 | 11/2003 | Watabe et al. | |
| 2007/0200537 A1* | 8/2007 | Akiyama | ................ H01L 25/16 323/234 |
| 2015/0171066 A1* | 6/2015 | Yamamichi | ............. H01L 24/97 257/411 |

FOREIGN PATENT DOCUMENTS

JP      H09-120995 A      5/1997

* cited by examiner

*Primary Examiner* — Hung K Vu
(74) *Attorney, Agent, or Firm* — Studebaker & Brackett PC

(57) ABSTRACT

A method of manufacturing a power semiconductor module according to the present invention includes the steps of: (a) forming a 6-in-1 chip 1 that is a power semiconductor chip incorporating a plurality of lateral power transistors; (b) forming control chips configured to control the 6-in-1 chip 1 according to a process rule different from a process rule of the 6-in-1 chip 1; and (c) forming one power semiconductor module with the 6-in-1 chip 1 and the control chips.

20 Claims, 4 Drawing Sheets

F I G. 6
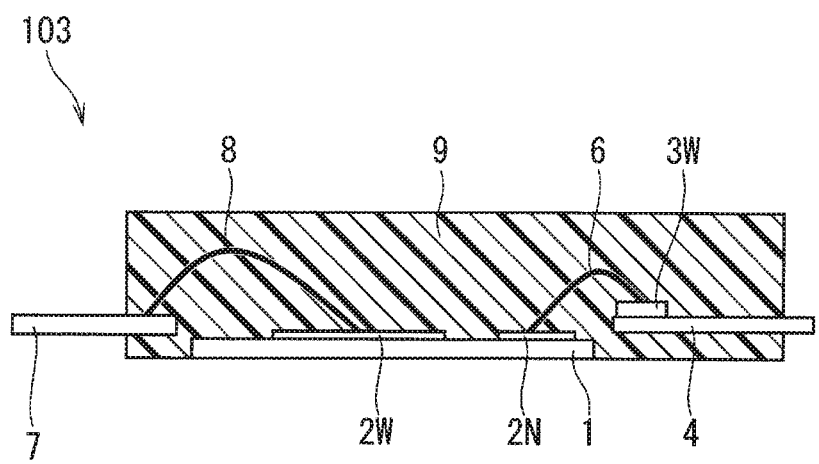
F I G. 7
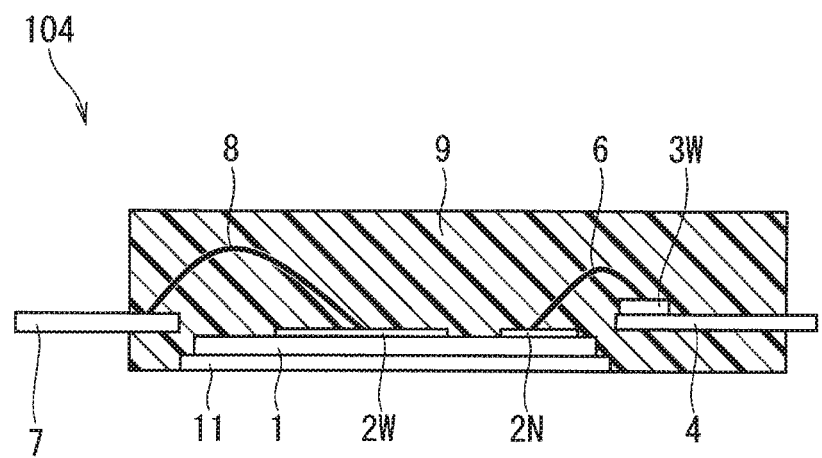

METHOD OF MANUFACTURING POWER SEMICONDUCTOR MODULE INCLUDING A POWER SEMICONDUCTOR CHIP AND A CONTROL CHIP FORMED ACCORDING TO DIFFERENT PROCESS RULES, AND POWER SEMICONDUCTOR MODULE

BACKGROUND OF THE INVENTION

Field of the Invention

The present invention relates to a method of manufacturing a power semiconductor module.

Description of the Background Art

A power semiconductor module includes a power chip and a control chip. Since the power chip is energized in a thickness direction thereof, the back surface of the power chip serves as an electrode. Therefore, a plurality of power chips are necessary to form a power semiconductor module of a plurality of phases (arms). As a countermeasure against this problem, Japanese Patent Application Laid-Open No. 09-120995 (1997) discloses a one-chip module that is formed by mounting a plurality of lateral power semiconductor elements and a control circuit on one chip.

According to a conventional one-chip module, however, the temperature of a control circuit rises due to the heat generated when the power module is energized. Therefore, the control circuit needs to be designed to have a high operation limit temperature, which causes a problem that the circuit becomes large in scale.

SUMMARY

An object of the present invention is miniaturization of a power semiconductor module.

A method of manufacturing a power semiconductor module according to the present invention includes the steps of (a) forming a power semiconductor chip, (b) forming a control chip, and (c) forming one power semiconductor module. The power semiconductor chip includes a plurality of lateral power transistors. The control chip is configured to control the power semiconductor chip and is formed according to a process rule different from that of the power semiconductor chip. The power semiconductor module is formed with the power semiconductor chip formed in the step (a) and the control chip formed in the step (b).

According to the method of manufacturing a power semiconductor module of the present invention, the control chip and a chip incorporating the lateral power transistors are formed as separate chips, and thus the control chip is less influenced by the heat generated at the time of conduction of the lateral power transistors. Therefore, the operation limit temperature of the control chip can be designed to be low, which enables miniaturization of the control chip and therefore miniaturization of the power semiconductor module. Further, since the power semiconductor chip and the control chip are formed according to different process rules, the control chip can be formed according to the most suitable process rule, so that the control chips can be miniaturized.

A power semiconductor module according to the present invention includes a power semiconductor chip and a control chip. The power semiconductor chip includes a plurality of lateral power transistors. The control chip is configured to control the power semiconductor chip. The circuit line width of the semiconductor of the control chip is smaller than the circuit line width of the semiconductor of the power semiconductor chip.

According to the power semiconductor module of the present invention, miniaturization of the control chip and therefore miniaturization of the power semiconductor module can be achieved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a sectional view showing a configuration of a power semiconductor module according to a third preferred embodiment; and FIG. 7 is a sectional view showing a configuration of a power semiconductor module according to a fourth preferred embodiment.

DESCRIPTION OF THE PREFERRED EMBODIMENTS

A. First Preferred Embodiment

<A-1. Configuration>

Figure 1:
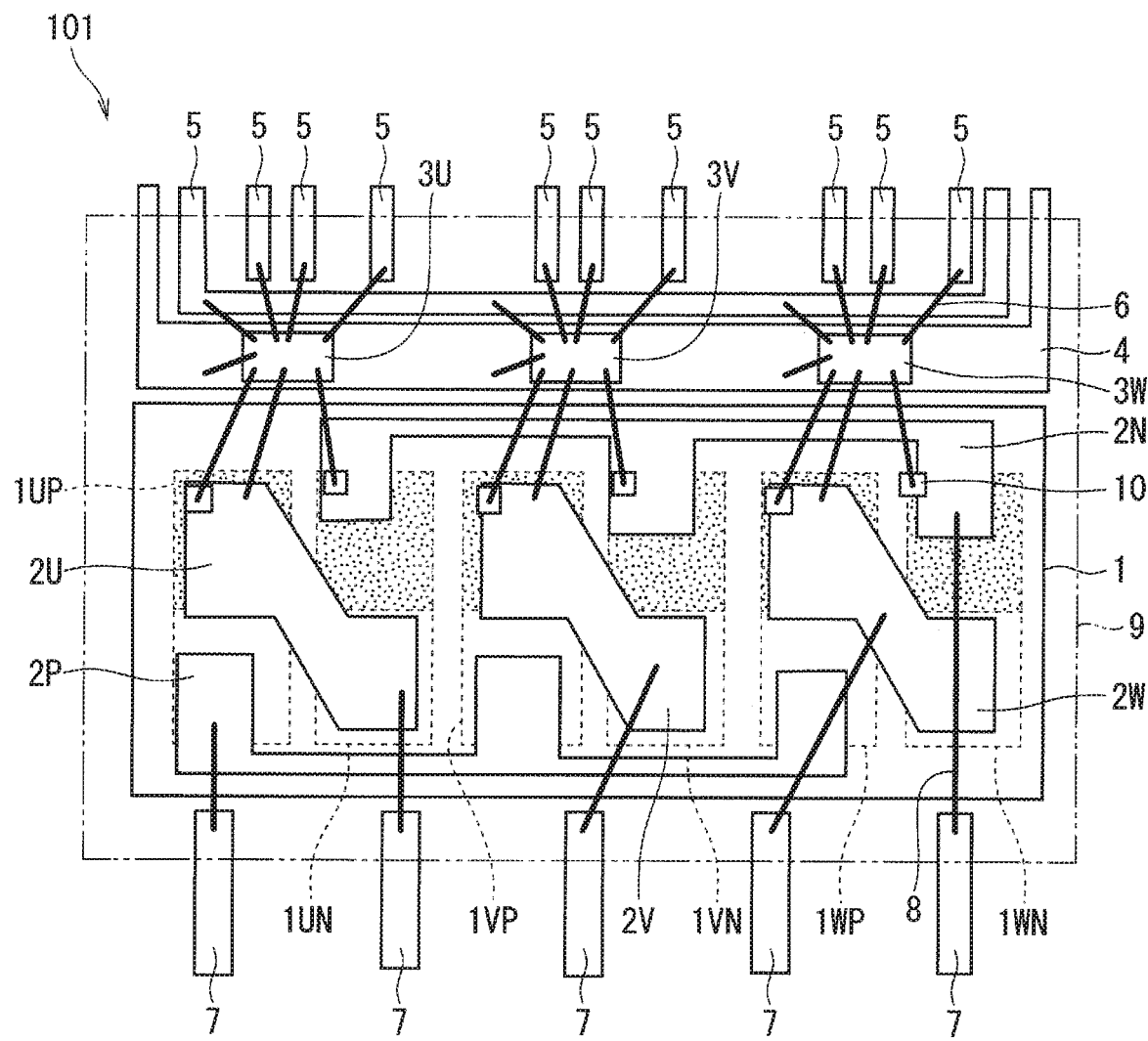
FIG. 1 is a plan view showing a configuration of a power semiconductor module according to a first preferred embodiment.
Figure 2:
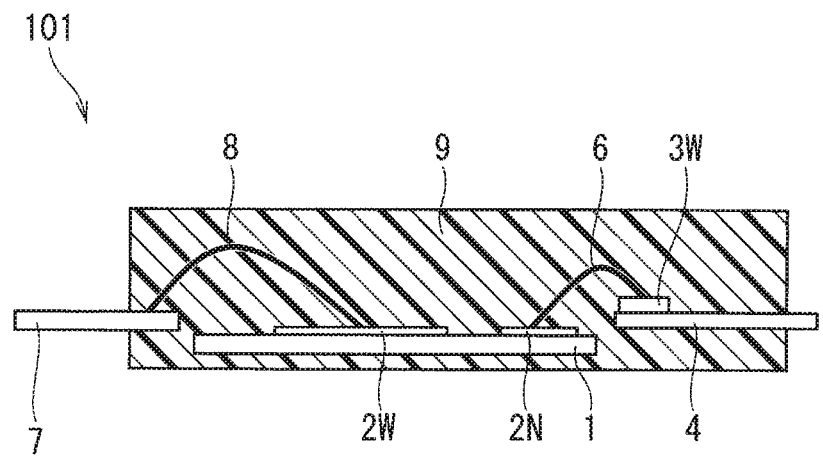
FIG. 2 is a sectional view showing the configuration of the power semiconductor module according to the first preferred embodiment.

FIG. 1 is a plan view of a power semiconductor module 101 according to a first preferred embodiment, and FIG. 2 is a sectional view of the power semiconductor module 101.

The power semiconductor module 101 includes a 6-in-1 chip 1, control chips 3U, 3V, 3W, a frame 4, control terminals 5, and power terminals 7.

The 6-in-1 chip 1 has a configuration in which six power transistors are formed on one semiconductor substrate. The six power transistors are a power transistor 1UP of a U-phase upper arm, a power transistor 1UN of a U-phase lower arm, a power transistor 1VP of a V-phase upper arm, a power transistor 1VN of a V-phase lower arm, a power transistor 1WP of a W-phase upper arm, and a power transistor 1WN of a W-phase lower arm.

All of the power transistors constituting the 6-in-1 chip 1 are lateral power transistors. In each of the power transistors shown in FIG. 1, a region shown by a stippled pattern is a source region, and a region without a stippled pattern is a drain region. Note that the power transistor is not limited to a metal-oxide-semiconductor field-effect transistor (MOS-FET), and may be an insulated-gate bipolar transistor (IGBT). In such a case, a collector region replaces the drain region.

The source region of the power transistor 1UP and the drain region of the power transistor 1UN are electrically connected to each other by a metal pattern 2U. In addition, the source region of the power transistor 1VP and the drain region of the power transistor 1VN are electrically connected to each other by a metal pattern 2V. Further, the source region of the power transistor 1WP and the drain region of the power transistor 1WN are electrically connected to each other by a metal pattern 2W.

The drain regions of the power transistors 1UP, 1VP, 1WP are electrically connected to one another by a metal pattern 2P. In addition, the drain regions of the power transistors 1UN, 1VN, 1WN are electrically connected to one another by a metal pattern 2N.

The metal pattern 2U includes a gate pad 10 that is electrically connected to the gate electrode of the power transistor 1UP. In the same manner, each of the metal patterns 2V, 2W includes a gate pad 10 that is electrically connected to the gate electrode of corresponding one of the power transistors 1VP, 1WP.

The control chips 3U, 3V, 3W are mounted on the frame 4. Each of the control chips 3U, 3V, 3W is electrically connected to four of the control terminals 5 and the frame 4 by input wires 6. Further, the control chip 3U is electrically connected to the gate pads 10 provided on the metal patterns 2U, 2N, and the metal pattern 2U by input wires 6. The control chip 3U is a chip configured to control the U-phase power transistors 1UP, 1UN.

The control chip 3V is electrically connected to the gate pads 10 provided on the metal patterns 2V, 2N, and the metal pattern 2V by input wires 6. The control chip 3V is a chip configured to control the V-phase power transistors 1VP, 1VN.

The control chip 3W is electrically connected to the gate pads 10 provided on the metal patterns 2W, 2N, and the metal pattern 2W by input wires 6. The control chip 3W is a chip configured to control the W-phase power transistors 1WP, 1WN.

The metal patterns 2P, 2N, 2U, 2V, 2W are electrically connected to the power terminals 7 by output wires 8.

The components constituting the power semiconductor module 101 described so far are sealed with a molding resin 9. As shown in FIG. 2, the frame 4 and the power terminals 7 are partly exposed from the molding resin 9. Although not shown in FIG. 2, the control terminals 5 are also partly exposed from the molding resin 9.

Although FIGS. 1 and 2 each show the power semiconductor module 101 as a molded-type semiconductor module, the power semiconductor module 101 may also be a case-type semiconductor module. Further, the control terminals 5 and the power terminals 7 may be either of insertion terminals or surface-mounted terminals.

<A-2. Manufacturing Method>

Figure 3:
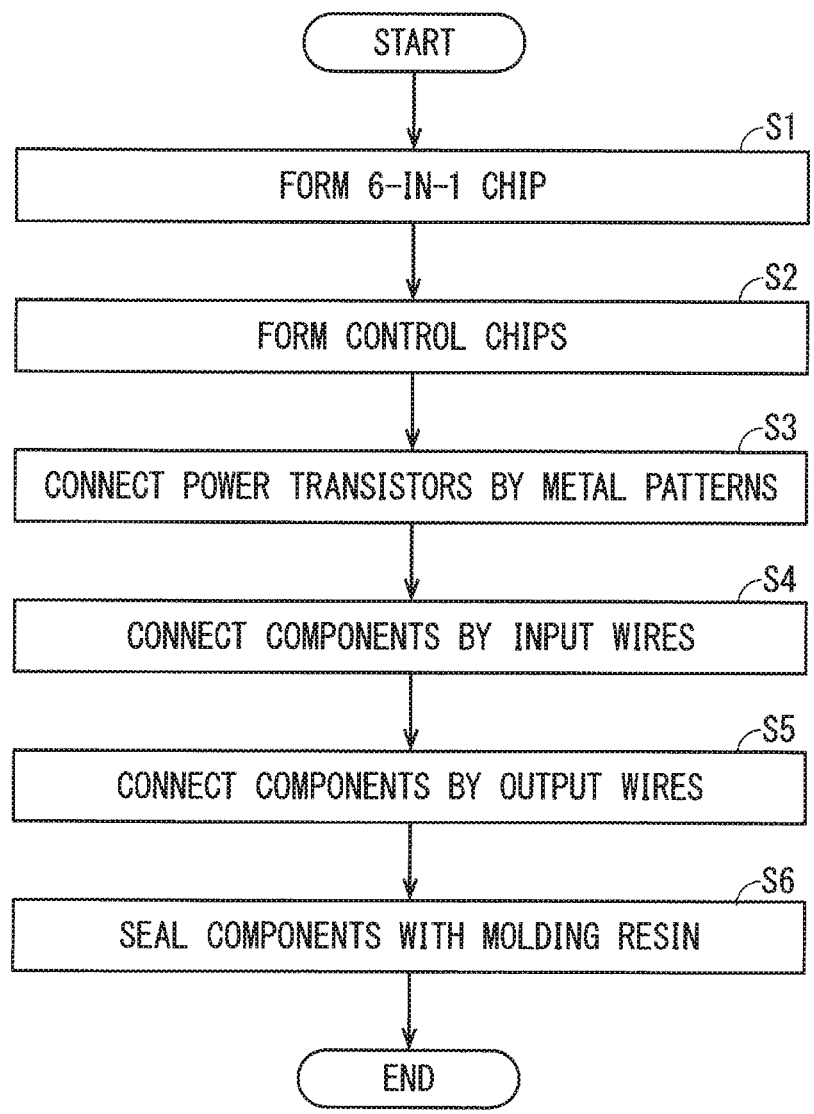
FIG. 3 is a flowchart showing a manufacturing process of the power semiconductor module according to the first preferred embodiment.

FIG. 3 is a flowchart showing a method of manufacturing the power semiconductor module 101 according to the first preferred embodiment. Hereinafter, a method of manufacturing the power semiconductor module 101 will be described with reference to FIG. 3.

First, the 6-in-1 chip 1 incorporating the six power transistors 1UP, 1UN, 1VP, 1VN, 1WP, 1WN is formed (step S1).

Next, the control chips 3U, 3V, 3W configured to control the 6-in-1 chip 1 are formed according to a process rule different from that of the 6-in-1 chip 1, and are mounted on the frame 4 (step S2). The process rule used herein is, for example, a rule concerning a line width of a circuit, and the control chips 3U, 3V, 3W are formed with a line width smaller than that of the 6-in-1 chip 1.

Then, a plurality of the power transistors are electrically connected to one another by the metal patterns 2N, 2P, 2U, 2V, 2W (step S3).

Thereafter, each of the control chips 3U, 3V, 3W is electrically connected to the corresponding control terminals 5, the frame 4, the metal pattern 2N, and corresponding one of the metal patterns 2U, 2V, 2W by input wires 6 (step S4). Further, the metal patterns 2N, 2P, 2U, 2V, 2W are electrically connected to the power terminals 7 by the output wires 8 (step S5).

Finally, the control chips 3U, 3V, 3W, the 6-in-1 chip 1, the metal patterns 2N, 2P, 2U, 2V, 2W, the input wires 6, and the output wires 8 are sealed with the molding resin 9 (step S6).

Thus, the power semiconductor module 101 is manufactured. In the flowchart of FIG. 3, either step S2 or step S3 may be performed first. Also, either step S4 or step S5 may be performed first.

Although this preferred embodiment employs the 6-in-1 chip as a power semiconductor chip, the number of integrated lateral power transistors in a power semiconductor chip is not limited to six. For example, the power semiconductor chip may be a 2-in-1 chip in which two lateral power transistors are integrated, or a 4-in-1 chip in which four lateral power transistors are integrated. Further, these modifications can also be applied to the preferred embodiments described below.

<A-3. Effect>

A method of manufacturing a power semiconductor module according to this preferred embodiment includes the steps of: (a) forming the 6-in-1 chip 1 that is a power semiconductor chip incorporating a plurality of lateral power transistors 1UP, 1UN, 1VP, 1VN, 1WP, 1WN; (b) forming the control chips 3U, 3V, 3W configured to control the 6-in-1 chip 1 according to a process rule different from a process rule of the 6-in-1 chip 1; and (c) forming one power semiconductor module with the 6-in-1 chip 1 formed in the step (a) and the control chips 3U, 3V, 3W formed in the step (b). With this manufacturing method, since the control chips 3U, 3V, 3W are formed separately from the chip incorporating the lateral power transistors 1UP, 1UN, 1VP, 1VN, 1WP, 1WN, the control chips 3U, 3V, 3W are less influenced by heat generated at the time of conduction of the lateral power transistors 1UP, 1UN, 1VP, 1VN, 1WP, 1WN.

Therefore, the operation limit temperature of the control chips 3U, 3V, 3W can be designed to be low, which achieves miniaturization of the control chips 3U, 3V, 3W and miniaturization of the entire power semiconductor module 101. Further, since the 6-in-1 chip 1 and the control chips 3U, 3V, 3W are formed according to different process rules, the control chips 3U, 3V, 3W can be formed according to the most suitable process rule, so that the control chips 3U, 3V, 3W can be miniaturized.

In the method of manufacturing a power semiconductor module according to this preferred embodiment, the step (b) is a step of forming the control chips 3U, 3V, 3W with a circuit line width smaller than that of the 6-in-1 chip 1. Accordingly, it is possible to miniaturize the control chips 3U, 3V, 3W.

Further, the power semiconductor module 101 according to this preferred embodiment includes the 6-in-1 chip 1, which is a power semiconductor chip incorporating the lateral power transistors 1UP, 1UN, 1VP, 1VN, 1WP, 1WN, and the control chips 3U, 3V, 3W configured to control the 6-in-1 chip 1. The control chips 3U, 3V, 3W each are formed with a circuit line width of the semiconductor that is smaller than the circuit line width of the semiconductor of the 6-in-1 chip 1. Accordingly, it is possible to miniaturize the control chips 3U, 3V, 3W.

B. Second Preferred Embodiment

<B-1. Configuration>

The configuration of a second preferred embodiment will be described below by assigning the same reference numerals to the components common to or corresponding to those of the first preferred embodiment.

Figure 4:
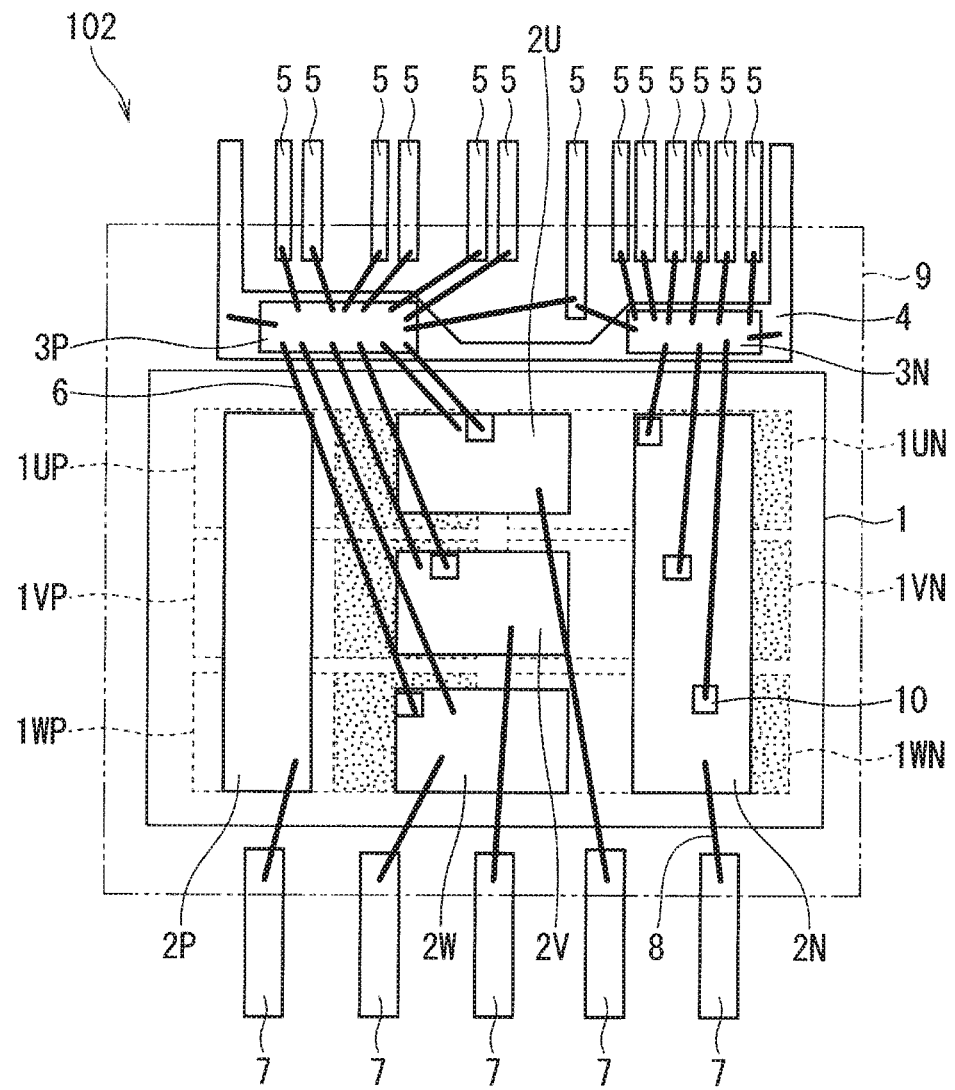
FIG. 4 is a plan view showing a configuration of a power semiconductor module according to a second preferred embodiment.
Figure 5:
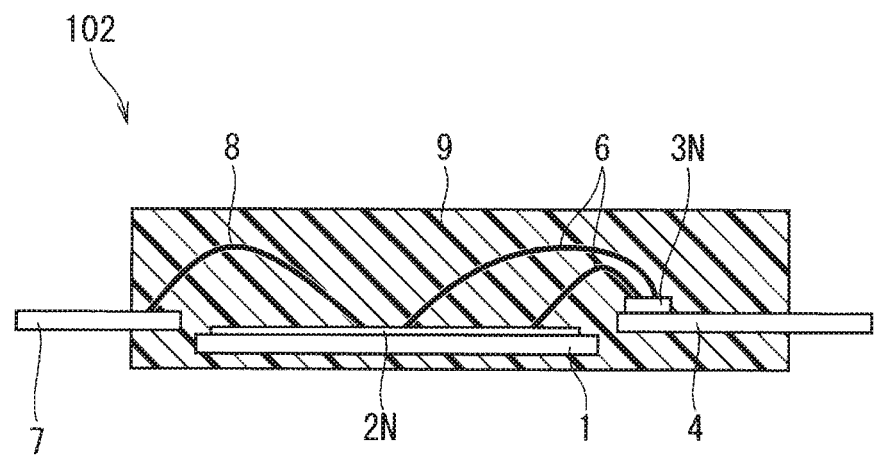
FIG. 5 is a sectional view showing the configuration of the power semiconductor module according to the second preferred embodiment.

FIG. 4 is a plan view of a power semiconductor module 102 according to the second preferred embodiment, and FIG. 5 is a sectional view of the power semiconductor module 102.

The power semiconductor module 102 includes a 6-in-1 chip 1, control chips 3P, 3N, a frame 4, control terminals 5, and power terminals 7.

The 6-in-1 chip 1 incorporates a power transistor 1UP of a U-phase upper arm, a power transistor 1UN of a U-phase lower arm, a power transistor 1VP of a V-phase upper arm, a power transistor 1VN of a V-phase lower arm, a power transistor 1WP of a W-phase upper arm, and a power transistor 1WN of a W-phase lower arm. In the 6-in-1 chip 1 of the power semiconductor module 101, the power transistors 1UP, 1UN, 1VP, 1VN, 1WP, 1WN are arranged in this order in one row. On the other hand, in the 6-in-1 chip 1 of the power semiconductor module 102, the power transistors are arranged in three rows and two columns. That is, in FIG. 4, the power transistors 1UP, 1VP, 1WP are arranged in the left column such that the source regions thereof and the drain regions thereof each are aligned on the same side, and the power transistors 1UN, 1VN, 1WN are arranged in the right column such that the source regions thereof and the drain regions thereof each are aligned on the same side.

The manner in which the power transistors 1UP, 1UN, 1VP, 1VN, 1WP, 1WN are connected by metal patterns 2P, 2N, 2U, 2V, 2W, and the arrangement of gate pads 10 in the power semiconductor module 102 are the same as those of the power semiconductor module 101.

The frame 4 includes control chips 3P, 3N mounted thereon. Each of the control chips 3P, 3N is electrically connected to six of the control terminals 5 and the frame 4 by input wires 6. In addition, the control chip 3P is electrically connected to the gate pads 10 provided on the metal patterns 2U, 2V, 2W, and the metal patterns 2U, 2V, 2W by input wires 6. The control chip 3P is a chip configured to control the power transistors 1UP, 1VP, 1WP each constituting the lower arm of each phase among the power transistors incorporated in the 6-in-1 chip 1, and is also referred to as a lower-arm control chip in this specification.

The control chip 3N is electrically connected to the gate pads 10 provided on the metal pattern 2N by input wires 6. The control chip 3N is a chip configured to control the power transistors 1UN, 1VN, 1WN each constituting the upper arm of each phase among the power transistors incorporated in the 6-in-1 chip 1, and is also referred to as an upper-arm control chip in this specification.

The metal patterns 2P, 2N, 2U, 2V, 2W are electrically connected to the power terminals 7 by output wires 8.

The components constituting the power semiconductor module 102 described so far are sealed with a molding resin 9. As shown in FIG. 5, the frame 4 and the power terminals 7 are partly exposed from the molding resin 9. Although not shown in FIG. 5, the control terminals 5 are also partly exposed from the molding resin 9.

Although FIGS. 4 and 5 each show the power semiconductor module 102 as a molded-type semiconductor module, the power semiconductor module 102 may also be a case-type semiconductor module. Further, the control terminals 5 and the power terminals 7 may be either of insertion terminals or surface-mounted terminals.

<B-2. Manufacturing Method>

A method of manufacturing the power semiconductor module 102 according to the second preferred embodiment will be described with reference to the flowchart of FIG. 3.

First, the 6-in-1 chip 1 incorporating the six power transistors 1UP, 1UN, 1VP, 1VN, 1WP, 1WN is formed (step S1).

Next, the control chips 3P, 3N are formed according to a process rule different from that of the 6-in-1 chip 1, and are mounted on the frame 4 (step S2). The process rule used herein is, for example, a rule concerning a line width of a circuit, and the control chips 3P, 3N are formed with a line width smaller than that of the 6-in-1 chip 1. Further, the control chip 3N is formed with a line width smaller than that of the control chip 3P. That is, the following relation holds for a circuit line width of a semiconductor: 6-in-1 chip 1>control chip 3P>control chip 3N.

Next, the power transistors 1UP, 1UN, 1VP, 1VN, 1WP, 1WN are electrically connected to one another by the metal patterns 2N, 2P, 2U, 2V, 2W (step S3).

Thereafter, the control chip 3P is electrically connected to the corresponding control terminals 5, the frame 4, the metal patterns 2U, 2V, 2W, and the corresponding gate pads 10 by input wires 6, and the control chip 3N is electrically connected to the corresponding control terminals 5, the frame 4, and the metal pattern 2N by the input wires 6 (step S4).

Further, the metal patterns 2N, 2P, 2U, 2V, 2W are electrically connected to the power terminals 7 by the output wires 8 (step S5).

Finally, the control chips 3N, 3P, the 6-in-1 chip 1, the metal patterns 2N, 2P, 2U, 2V, 2W, the input wires 6, and the output wires 8 are sealed with the molding resin 9 (step S6). Thus, the power semiconductor module 102 is manufactured.

<B-3. Effect>

In the power semiconductor module 102 according to the second preferred embodiment, the control chip includes: a control chip 3N that is an upper-arm control chip configured to control the power transistors 1UN, 1VN, 1WN that operate as upper arms among a plurality of lateral power transistors; and a control chip 3P that is a lower-arm control chip configured to control the power transistors 1UP, 1VP, 1WP that operate as lower arms among the plurality of lateral power transistors. In the manufacturing process of the power semiconductor module according to the second preferred embodiment, the control chip 3N is formed according to a process rule different from that of the control chip 3P. Therefore, miniaturization of the power semiconductor module 102 can be achieved by forming each of the control chip 3N and the control chip 3P according to the most suitable process rule.

In the manufacturing process of the power semiconductor module according to the second preferred embodiment, the control chip 3P that is a lower-arm control chip is formed with a circuit line width smaller than that of the control chip 3N that is an upper-arm control chip. The upper-arm control chip, which requires a higher breakdown voltage than that of the lower-arm control chip, is formed with a circuit line width larger than that of the lower-arm control chip, thereby ensuring a high-breakdown voltage of the upper-arm control chip and achieving miniaturization of the lower-arm control chip.

Thus, miniaturization of the power semiconductor module 102 is achieved.

C. Third Preferred Embodiment

<C-1. Configuration>

FIG. 6 is a sectional view of a power semiconductor module 103 according to a third preferred embodiment. In the power semiconductor module 101 according to the first preferred embodiment, the 6-in-1 chip 1 is entirely sealed with the molding resin 9 as shown in FIG. 2. On the other hand, in the power semiconductor module 103 according to the third preferred embodiment, the lower surface of the 6-in-1 chip 1 is exposed from the molding resin 9 as shown in FIG. 6. The other configurations of the power semiconductor module 103 are the same as those of the power semiconductor module 101.

In the third preferred embodiment, the configuration in which the lower surface of the 6-in-1 chip 1 of the power semiconductor module 101 according to the first preferred embodiment is exposed from the molding resin 9 has been described, but the third preferred embodiment may have a configuration in which the lower surface of the 6-in-1 chip 1 of the power semiconductor module 102 according to the second preferred embodiment is exposed from the molding resin 9.

<C-2. Effect>

The method of manufacturing a power semiconductor module according to the third preferred embodiment includes the step of (c1) sealing the 6-in-1 chip 1 that is a power semiconductor chip except a lower surface thereof and the control chips 3U, 3V, 3W with a molding resin 9. Since the lower surface of the 6-in-1 chip 1 is exposed from the molding resin 9, the lower surface of the 6-in-1 chip 1 serves as a heat dissipation surface for releasing heat to the outside of the power semiconductor module. This enables reduction in the steady-state thermal resistance between the 6-in-1 chip 1 and the heat dissipation surface.

D. Fourth Preferred Embodiment

<D-1. Configuration>

FIG. 7 is a sectional view of a power semiconductor module 104 according to a fourth preferred embodiment. The power semiconductor module 104 is formed by bonding a support 11 to the lower surface of the 6-in-1 chip 1 of the power semiconductor module 101 according to the first preferred embodiment, and exposing the lower surface of the support 11 from the molding resin 9. The support 11 is made of a material with good thermal conductivity such as a metal, for example. The other configurations of the power semiconductor module 104 are the same as those of the power semiconductor module 101.

In the fourth preferred embodiment, the configuration in which the lower surface of the support 11 bonded to the lower surface of the 6-in-1 chip 1 of the power semiconductor module 101 according to the first preferred embodiment is exposed from the molding resin 9 has been described. However, the fourth preferred embodiment may have a configuration in which the lower surface of the support 11 bonded to the lower surface of the 6-in-1 chip 1 of the power semiconductor module 102 according to the second preferred embodiment is exposed from the molding resin 9.

<D-2. Effect>

The method of manufacturing a power semiconductor module according to the fourth preferred embodiment includes the steps of: (c1) bonding the support 11 to the lower surface of the 6-in-1 chip 1 that is a power semiconductor chip; and (c2) sealing the support except the lower surface thereof, the 6-in-1 chip 1, and the control chips 3U, 3V, 3W with the molding resin 9. Since the lower surface of the support 11 is exposed from the molding resin 9, the lower surface of the support 11 serves as a heat dissipation surface for releasing heat to the outside of the power semiconductor module. This enables reduction in the transient thermal resistance between the 6-in-1 chip 1 and the heat dissipation surface.

It should be noted that the present invention also includes free combination of the embodiments as well as appropriate modification of and removal from the preferred embodiments within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a power semiconductor module, the method comprising the steps of:
   (a) forming a power semiconductor chip incorporating a plurality of lateral power transistors;
   (b) forming a control chip configured to control the power semiconductor chip according to first process rule different from second process rule of the power semiconductor chip, each of the first and second process rules concerning a respective line width of a respective circuit in a respective manufacturing process; and
   (c) forming one power semiconductor module with the power semiconductor chip formed in the step (a), a frame, and the control chip formed in the step (b), such that the control chip is mounted on the frame, the frame being separated from the power semiconductor chip.

2. The method of manufacturing a power semiconductor module according to claim 1, wherein the step (b) is a step of forming the control chip with a circuit line width smaller than a circuit line width of the power semiconductor chip.

3. The method of manufacturing a power semiconductor module according to claim 2,
   wherein the control chip includes:
   an upper-arm control chip configured to control a power transistor that operates as an upper arm among the plurality of lateral power transistors; and
   a lower-arm control chip configured to control a power transistor that operates as a lower arm among the plurality of lateral power transistors,
   wherein the step (b) is a step of forming the upper-arm control chip and the lower-arm control chip according to different process rules.

4. The method of manufacturing a power semiconductor module according to claim 3, wherein the step (b) is a step of forming the lower-arm control chip with a circuit line width smaller than a circuit line width of the upper-arm control chip.

5. The method of manufacturing a power semiconductor module according to claim 4, wherein the step (c) includes the step of (c1) sealing the power semiconductor chip except a lower surface thereof and the control chip with a molding resin.

6. The method of manufacturing a power semiconductor module according to claim 4, wherein the step (c) includes the steps of:
(c1) bonding a support to a lower surface of the power semiconductor chip; and
(c2) sealing the support except a lower surface thereof, the power semiconductor chip, and the control chip with a molding resin.

7. The method of manufacturing a power semiconductor module according to claim 3, wherein the step (c) includes the step of (c1) sealing the power semiconductor chip except a lower surface thereof and the control chip with a molding resin.

8. The method of manufacturing a power semiconductor module according to claim 3, wherein
the step (c) includes the steps of:
(c1) bonding a support to a lower surface of the power semiconductor chip; and
(c2) sealing the support except a lower surface thereof, the power semiconductor chip, and the control chip with a molding resin.

9. The method of manufacturing a power semiconductor module according to claim 2, wherein the step (c) includes the step of (c1) sealing the power semiconductor chip except a lower surface thereof and the control chip with a molding resin.

10. The method of manufacturing a power semiconductor module according to claim 2, wherein
the step (c) includes the steps of:
(c1) bonding a support to a lower surface of the power semiconductor chip; and
(c2) sealing the support except a lower surface thereof, the power semiconductor chip, and the control chip with a molding resin.

11. The method of manufacturing a power semiconductor module according to claim 1,
wherein the control chip includes:
an upper-arm control chip configured to control a power transistor that operates as an upper arm among the plurality of lateral power transistors; and
a lower-arm control chip configured to control a power transistor that operates as a lower arm among the plurality of lateral power transistors,
wherein the step (b) is a step of forming the upper-arm control chip and the lower-arm control chip according to different process rules.

12. The method of manufacturing a power semiconductor module according to claim 11, wherein the step (b) is a step of forming the lower-arm control chip with a circuit line width smaller than a circuit line width of the upper-arm control chip.

13. The method of manufacturing a power semiconductor module according to claim 12, wherein the step (c) includes the step of (c1) sealing the power semiconductor chip except a lower surface thereof and the control chip with a molding resin.

14. The method of manufacturing a power semiconductor module according to claim 12, wherein
the step (c) includes the steps of:
(c1) bonding a support to a lower surface of the power semiconductor chip; and
(c2) sealing the support except a lower surface thereof, the power semiconductor chip, and the control chip with a molding resin.

15. The method of manufacturing a power semiconductor module according to claim 11, wherein the step (c) includes the step of (c1) sealing the power semiconductor chip except a lower surface thereof and the control chip with a molding resin.

16. The method of manufacturing a power semiconductor module according to claim 11, wherein
the step (c) includes the steps of:
(c1) bonding a support to a lower surface of the power semiconductor chip; and
(c2) sealing the support except a lower surface thereof, the power semiconductor chip, and the control chip with a molding resin.

17. The method of manufacturing a power semiconductor module according to claim 1, wherein the step (c) includes the step of (c1) sealing the power semiconductor chip except a lower surface thereof and the control chip with a molding resin.

18. The method of manufacturing a power semiconductor module according to claim 1, wherein
the step (c) includes the steps of:
(c1) bonding a support to a lower surface of the power semiconductor chip; and
(c2) sealing the support except a lower surface thereof, the power semiconductor chip, and the control chip with a molding resin.

19. A power semiconductor module comprising:
a power semiconductor chip incorporating a plurality of lateral power transistors;
a frame that is separated from the power semiconductor chip; and
a control chip formed according to first process rule different from second process rule of the power semiconductor chip, each of the first and second process rules concerning a respective line width of a respective circuit in a respective manufacturing process, such that a circuit line width of the control chip is smaller than a circuit line width of the power semiconductor chip,
wherein the control chip is mounted on the frame and configured to control the power semiconductor chip.

20. The power semiconductor module according to claim 19,
wherein the control chip includes:
an upper-arm control chip that includes a semiconductor and is configured to control a power transistor that operates as an upper arm among the plurality of lateral power transistors; and
a lower-arm control chip that includes a semiconductor and is configured to control a power transistor that operates as a lower arm among the plurality of lateral power transistors,
wherein a circuit line width of the semiconductor of the lower-arm control chip is smaller than a circuit line width of the semiconductor of the upper-arm control chip.

\* \* \* \* \*